United States Patent
Ahmed

(10) Patent No.: US 7,298,854 B2
(45) Date of Patent: Nov. 20, 2007

(54) APPARATUS, METHODS AND ARTICLES OF MANUFACTURE FOR NOISE REDUCTION IN ELECTROMAGNETIC SIGNAL PROCESSING

(75) Inventor: Walid K. M. Ahmed, Tinton Falls, NJ (US)

(73) Assignee: M/A-COM, Inc., Lowell, MA (US)

( * ) Notice: Subject to any disclaimer, the term of this patent is extended or adjusted under 35 U.S.C. 154(b) by 827 days.

(21) Appl. No.: 10/309,518

(22) Filed: Dec. 4, 2002

(65) Prior Publication Data

US 2004/0109572 A1   Jun. 10, 2004

(51) Int. Cl.
*H04B 15/00* (2006.01)
*H04R 1/40* (2006.01)

(52) U.S. Cl. .................. 381/94.1; 381/97; 708/300

(58) Field of Classification Search ............... 381/97, 381/102, 17; 708/300
See application file for complete search history.

(56) References Cited

U.S. PATENT DOCUMENTS

| | | | |
|---|---|---|---|
| 3,900,823 A * | 8/1975 | Sokal et al. ............ 330/149 |
| 3,978,422 A | 8/1976 | Rheinfelder | |
| 4,276,620 A | 6/1981 | Kahn et al. ............ 367/60 |
| 4,580,111 A | 4/1986 | Swanson .............. 332/41 |
| 4,586,000 A | 4/1986 | Wagner | |
| 4,646,359 A | 2/1987 | Furrer | |
| 4,888,808 A * | 12/1989 | Ishikawa et al. ........ 381/103 |
| 5,051,942 A * | 9/1991 | Matsumoto et al. ..... 708/300 |
| 5,095,507 A * | 3/1992 | Lowe .................. 381/17 |
| 5,142,240 A * | 8/1992 | Isota et al. ............ 330/149 |
| 5,278,997 A | 1/1994 | Martin | |
| 5,311,143 A | 5/1994 | Soliday | |
| 5,377,274 A * | 12/1994 | Meyer et al. ........... 381/59 |
| 5,410,280 A | 4/1995 | Linguet et al. | |
| 5,524,286 A | 6/1996 | Chiesa et al. .......... 455/126 |
| 5,598,436 A | 1/1997 | Brajal et al. ........... 375/297 |
| 5,642,002 A | 6/1997 | Mekanik et al. | |
| 5,774,017 A | 6/1998 | Adar | |
| 5,818,298 A | 10/1998 | Dent et al. | |
| 5,880,633 A | 3/1999 | Leizerovich et al. | |
| 5,886,913 A | 3/1999 | Marguinaud et al. . 364/724.011 |
| 5,892,431 A | 4/1999 | Osterman | |
| 5,905,760 A | 5/1999 | Schnabl et al. ......... 375/296 |
| 5,930,128 A | 7/1999 | Dent | |

(Continued)

FOREIGN PATENT DOCUMENTS

EP   1 170 915   1/2002

(Continued)

OTHER PUBLICATIONS

Written Opinion, International application No., PCT/US 03/32023, International filing dated Jul. 10, 2003, Date of mailing Jul. 29, 2004, Priority date Aug. 10, 2002, International Patent Classification H03H17/02.

(Continued)

*Primary Examiner*—Xu Mei

(57) ABSTRACT

Apparatus, methods and articles of manufacture are disclosed for modifying electromagnetic waves by reducing noise in those waves. A transfer function for a plurality of segments is derived through identifying a desired output parameter. That transfer function is then applied, via a plurality of filters or other devices, to a wave, in order to achieve said transfer function.

9 Claims, 4 Drawing Sheets

U.S. PATENT DOCUMENTS

| | | | |
|---|---|---|---|
| 5,939,951 | A | 8/1999 | Bateman et al. |
| 5,942,946 | A | 8/1999 | Su et al. |
| 5,952,895 | A | 9/1999 | McCune, Jr. et al. |
| 6,043,707 | A | 3/2000 | Budnik ........................ 330/10 |
| 6,043,712 | A | 3/2000 | Leizerovich et al. |
| 6,075,413 | A | 6/2000 | Katakura |
| 6,078,628 | A | 6/2000 | Griffith et al. |
| 6,094,101 | A | 7/2000 | Sander et al. |
| 6,097,252 | A | 8/2000 | Sigmon et al. |
| 6,101,224 | A | 8/2000 | Lindoff et al. |
| 6,112,071 | A | 8/2000 | McCune, Jr. |
| 6,125,266 | A | 9/2000 | Matero et al. .............. 455/126 |
| 6,133,788 | A | 10/2000 | Dent |
| 6,140,875 | A | 10/2000 | Van Den Homberg et al. |
| 6,140,882 | A | 10/2000 | Sander |
| 6,147,553 | A | 11/2000 | Kolanek ...................... 330/10 |
| 6,157,681 | A | 12/2000 | Daniel et al. |
| 6,191,653 | B1 | 2/2001 | Camp, Jr. et al. |
| 6,198,347 | B1 | 3/2001 | Sander et al. |
| 6,201,452 | B1 | 3/2001 | Dent et al. |
| 6,215,355 | B1 | 4/2001 | Meck et al. |
| 6,219,394 | B1 | 4/2001 | Sander |
| 6,236,284 | B1 | 5/2001 | Duello et al. |
| 6,242,975 | B1 | 6/2001 | Eidson et al. |
| 6,246,286 | B1 | 6/2001 | Persson |
| 6,255,906 | B1 | 7/2001 | Eidson et al. |
| 6,259,901 | B1 | 7/2001 | Shinomiya et al. |
| 6,269,135 | B1 | 7/2001 | Sander |
| 6,285,251 | B1 | 9/2001 | Dent et al. |
| 6,288,916 | B1 | 9/2001 | Liu et al. |
| 6,294,957 | B1 | 9/2001 | Luu |
| 6,311,046 | B1 | 10/2001 | Dent |
| 6,317,608 | B1 | 11/2001 | Glöcker |
| 6,321,072 | B1 | 11/2001 | Cipriani et al. |
| 6,323,731 | B1 | 11/2001 | McCune, Jr. |
| 6,356,155 | B1 | 3/2002 | Judkins |
| 6,366,177 | B1 | 4/2002 | McCune et al. |
| 6,369,657 | B2 | 4/2002 | Dening et al. |
| 6,377,784 | B2 | 4/2002 | McCune |
| 6,380,802 | B1 | 4/2002 | Pehike et al. |
| 6,404,823 | B1 | 6/2002 | Grange et al. |
| 6,411,655 | B1 | 6/2002 | Holden et al. |
| 6,426,677 | B1 | 7/2002 | Prentice |
| 6,426,678 | B1 | 7/2002 | Ko |
| 6,430,402 | B1 | 8/2002 | Agahi-Kesheh |
| 6,445,247 | B1 | 9/2002 | Walker |
| 6,449,465 | B1 | 9/2002 | Gailus et al. ................ 455/126 |
| 6,512,417 | B2 * | 1/2003 | Booth et al. ................. 330/149 |
| 6,621,340 | B1 | 9/2003 | Perthold et al. ............ 330/149 |
| 6,834,084 | B2 | 12/2004 | Hietala ........................ 375/296 |
| 2002/0098812 | A1 | 7/2002 | Sourour et al. .............. 455/91 |
| 2002/0186783 | A1 | 12/2002 | Opas et al. .................. 375/297 |
| 2002/0193085 | A1 | 12/2002 | Mathe et al. ................ 455/126 |
| 2003/0095608 | A1 | 5/2003 | Duperray ..................... 375/297 |
| 2003/0215025 | A1 | 11/2003 | Hietala ........................ 375/297 |
| 2003/0215026 | A1 | 11/2003 | Hietala ........................ 375/297 |
| 2004/0021517 | A1 | 2/2004 | Irvine et al. ................. 330/151 |
| 2004/0047432 | A1 | 3/2004 | Iwasaki ....................... 375/297 |
| 2005/0017801 | A1 | 1/2005 | Bachman, II et al. ...... 330/149 |
| 2005/0122164 | A1 | 6/2005 | Brandt et al. ................ 330/10 |

FOREIGN PATENT DOCUMENTS

| | | |
|---|---|---|
| GB | 1383 286 | 2/1974 |
| WO | WO 01/10013 A1 | 2/2001 |

OTHER PUBLICATIONS

"Tropian and Agilent Technologies announce collaboration on multi-band, multi-mode 2.5G transmitter solutions", Feb. 18, 2002, Connes, France.

"Tropian Awarded 8th U.S. Patent for Wireless Technology: Innovative RF Power Processing Circuit Architecture Achieves Speed and Accuracy in Polar Modulation," Aug. 6, 2001, Cupertino, California.

Dialog Web Command Mode, p. 1 of 1, Sep. 17, 2002, Record 03929207, Polar Modulators for 1 and 2 GHz Power Amplifier Correction, NISBET, J.

Dialog Web Command Mode, p. 1 of 1, Sep. 17, 2002, Record 0326082, A new Class-AB Design, De Jager, et al., Electronics World 105, Dec. 1999, p. 982-7.

Dialog Web Command Mode, p. 1 of 1, Sep. 17, 2002, Record 2371235, Increasing the talk-time of mobile radios with efficient linear transmitter architectures, Mann et al., Electronics & Communication Engineering Journal, v. 13, No. 2, Apr. 2001 (p. 65-76).

Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.

Dialog Web Command Mode, p. 1 of 9, Sep. 19, 2002, Record 10872787, Out-of-band emissions of digital transmissions using Kahn EER technique, Rudolph, IEEE Transactions on Microwave Theory & Techniques, 2002, V 50, N 8, Aug, p. 1979-1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

Hulick, "The Digital Linear Amplifier", Schwenksville, Pennsylvania, 1994.

Kozyrey, "Single-Ended Switching-Mode Tuned Power Amplifier with Filtering Circuit", Poluprovodnikovye pribory v tekhnike svyazi, 1971, pp. 152-166, vol. 6.

TimeStar™, "Multi-Mode Polar Modulator" 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998, pp. 35-42.

Mann, et al., "Increasing Talk-Time with Effecient Linear PAs", Presented at IEE Colloquim on Tetra Market and Technology Developments, Feb. 2000, London.

Mann, et al., "Increasing the Talk-Time of Mobile Radios with Effecient Linear Transmitter Architectures", Electronics & Communication Engineering Journal, Apr. 2001, pp. 65-76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131-133, vol. 35, No. 2.

Tropian-Products Main, www.tropian.com/products/, Copyright 2000-2001, Aug. 14, 2002.

\* cited by examiner

APPARATUS, METHODS AND ARTICLES OF MANUFACTURE FOR NOISE REDUCTION IN ELECTROMAGNETIC SIGNAL PROCESSING

FIELD OF THE INVENTION

The invention relates generally to electromagnetic signal processing, and more particularly to the reduction of noise in electromagnetic signal processing, and more particularly to the reduction of noise in segmented amplifiers used in RF transmitters.

BACKGROUND OF THE INVENTION

Electromagnetic waves have, until fairly recently, been modified using analog techniques. That is, there had been no attempt to isolate discrete wave characteristics such as current, voltage and the like and modify those characteristics in order to modify the wave itself. Recently, wave modification techniques have become digitized, so that characteristics of the wave can be isolated and modified directly in order to achieve a desired result. Digitization has become desirable because it usually provides more speed and precision in wave modification while drawing less power than previous methods.

For example, digitization of wave characteristics has led to improvements in filtering techniques. Through digitizing wave characteristics, it is possible to quickly and accurately create and/or modify, (e.g. implement, emphasize, isolate and filter) frequencies and other wave characteristics.

Accordingly, it would be helpful to the art of electromagnetic wave modification if apparatus, methods, and articles of manufacture were provided that utilize digitized electromagnetic wave characteristics in order to create and/or modify electromagnetic waves.

SUMMARY OF THE INVENTION

Embodiments of the present invention include apparatus, methods and articles of manufacture for modifying electromagnetic waves by reducing noise in those waves. The preferred method embodiments comprise a method of applying a transfer function wherein a desired output wave parameter is determined, an amplitude characteristic and a phase characteristic of an input wave are isolated, the transfer function is derived from the desired output wave parameter and the transfer function is applied to the amplitude characteristic of the wave. Following application of the transfer function, the amplitude characteristic and said phase characteristic may be combined so as to generate an output wave.

DETAILED DESCRIPTION OF THE PREFERRED EMBODIMENTS

Figure 1:
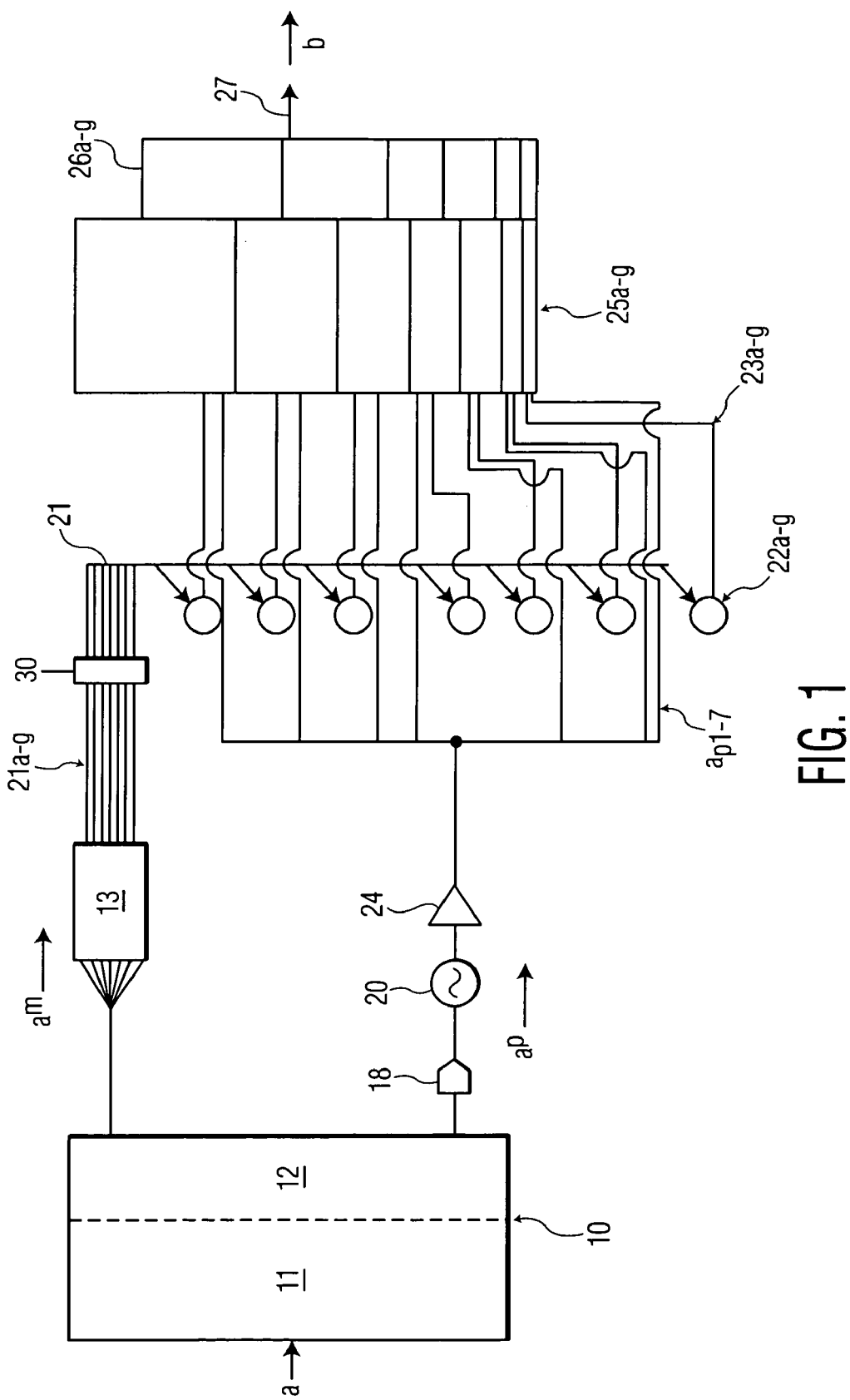
FIG. 1 shows a preferred embodiment.

FIG. 1 shows a preferred embodiment. An input wave a is provided to a Digital Signal Processor 10. Digital Signal Processor 10 comprises an Analog to Digital Converter 11, which digitizes the wave, for example, by the use of rectangular coordinates or I,Q data. Rectangular to Polar Converter 12 then receives the I,Q data and translates it into polar coordinates. It should be noted that, in other embodiments, a digitized representation of a wave may be provided to a rectangular to polar converter if desired. In those embodiments, the digitized representation may be generated in any of a number of ways as is known in the art. Also, while this embodiment is described as used in connection with a digitized wave and I,Q and polar data, those of ordinary skill in the art will appreciate that other embodiments are not limited thereto and may use any digital or analog wave form, or combination thereof.

Returning now to the embodiment of FIG. 1, Rectangular to Polar Converter 12 outputs a digitized wave in polar coordinates, which takes the form R, P(sin) and P(cos) for example. In this example, the R coordinate represents the amplitude characteristic of the wave. The P(sin) and P(cos) coordinates represent the phase characteristic of the wave. It should be noted that "characteristic," as used herein, refers to electromagnetic wave characteristics, such as frequency, voltage, amplitude (including magnitude and envelope), phase, current, wave shape, or pulse. Other embodiments may derive one or more wave characteristics from the input wave as desired.

Figure 2:
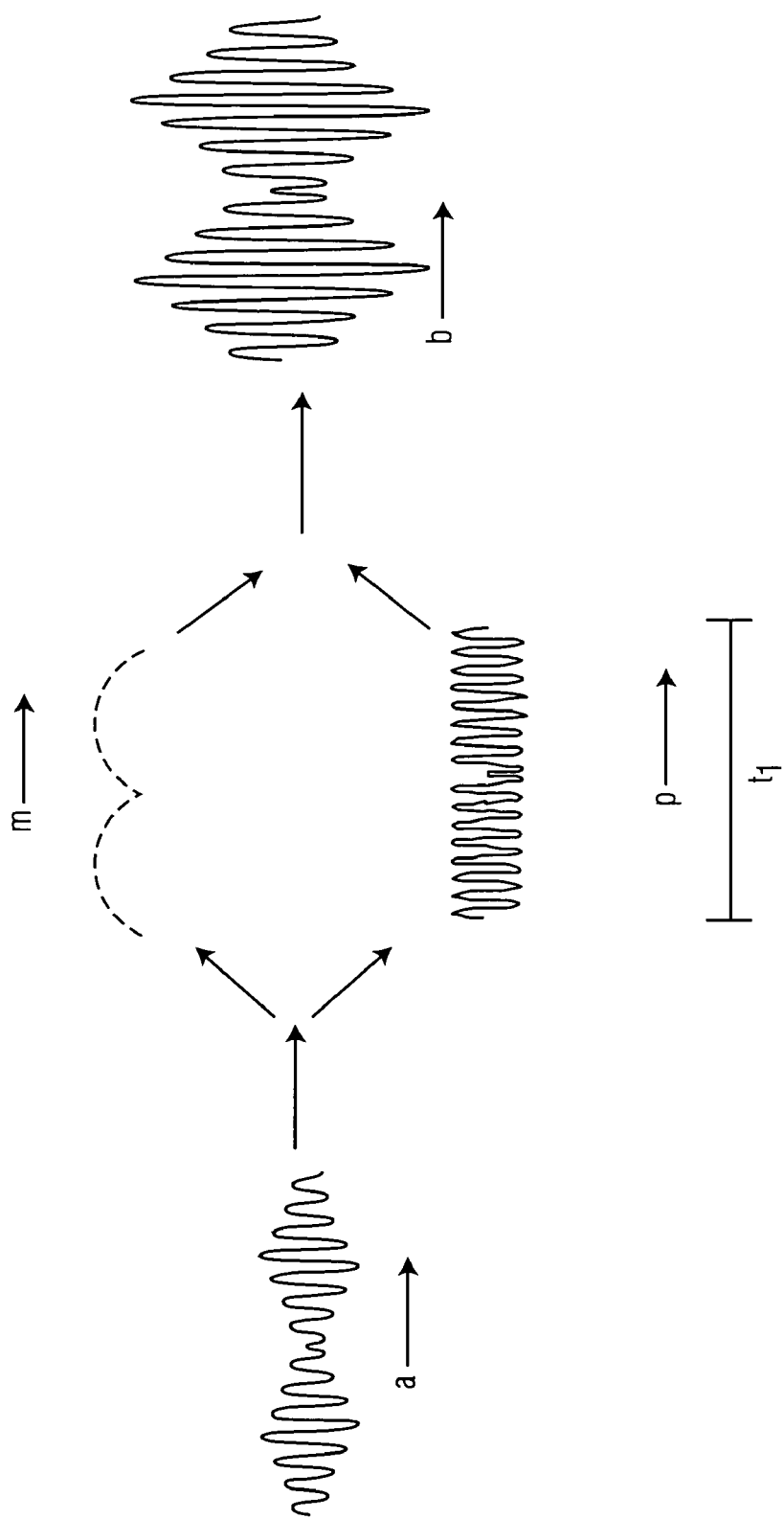
FIG. 2 shows a preferred embodiment.

Turning briefly to FIG. 2, a schematic diagram of a wave that has been translated according to the embodiment of FIG. 1 is shown. Input wave a has been translated into magnitude component m comprising magnitude characteristics of the input wave over period $t_1$ and phase component p comprising phase characteristics on a carrier wave over the same period. Output wave b is shown after amplification by a preferred embodiment. It should be noted that the time period in this and other embodiments is as desired. For example, embodiments may derive magnitude and phase characteristics of a wave using various sampling rates in order to maximize resolution of the wave, maximize speed of operation, etc. These sampling rates may be dynamically determined as well in various embodiments so that they change during operation. In the preferred embodiments, the division of an input wave is synchronized, in order to maximize accuracy of output and minimize any distortion.

Returning now to FIG. 1, amplitude and phase characteristics are then transmitted through separate paths. The amplitude characteristics of the input wave are converted, via converter 13, along path a''', into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input wave. The digital word provides control for attenuation and/or amplification, in manner to be described further below. Of course, as is described further below, in other embodiments, a differently composed digital word may be used, as well as other types of derivation and/or provision of amplitude or other wave characteristics.

Converter 13 then splits the bits, each of which are a time-domain square waveform onto separate paths 0 to N−1. Each bit enters low-pass filter bank 30 which is comprised of filters $F_0$ to $F_{n-1}$. The impulse response of filters F0 to Fn−1 is at $h(t)_0$ to $h(t)_{N-1}$ respectively, which is further described below.

In the embodiment of FIG. 1, seven control component lines 21a-g are shown leading away from the converter 13. The number of these control component lines depends, in the preferred embodiments, upon the resolution of the word. In this preferred embodiment, the word has a seven bit resolution. It should be noted in FIG. 1 that, for ease of viewing the figure, the control component lines are consolidated into a single path a''' leading into control components 22a-g. However, in the embodiment, and as further described below, the control component lines are not consolidated and instead feed into the control components individually.

The phase characteristic travels along path $a^p$. Here the phase characteristic is first modulated onto a wave by way of Digital to Analog Converter 18 and Synthesizer 20 (which is a Voltage Controlled Oscillator in an especially preferred embodiment.) Synthesizer 20 provides an output wave, which is comprised of the phase information. This output wave has a constant envelope, i.e., it has no amplitude variations, yet it has phase characteristics of the original input wave, and passes to driver 24, and in turn driver lines $a^p$ 1-$a^p$ 7. The wave, which has been split among the driver lines, is then fed into current sources 25*a*-25*g*, and will serve to potentially drive the current sources 25*a*-25*g* as is further described below. In other embodiments, other sources of other wave characteristics, i.e., besides the phase characteristic, may be used.

It should be noted that, in the present embodiment, transistors may be used as current sources 25*a*-25*g*. Additionally, in other embodiments, one or more transistors segmented appropriately may be used as current sources 25*a*-25*g*. The current sources 25*a*-25*g* must not be driven into saturation. Otherwise, the current sources will cease to act as current sources and instead act as voltage sources, which will interfere with the desired current combining of the sources.

Path $a^m$ (comprised of control component lines 21*a-g* as described above) terminates in control components 22*a-g*. In the especially preferred embodiment, these are switching transistors, and are preferably current sources, although, as further described below, in other embodiments, other sources of other wave characteristics may be used, as well as other regulation schemes. Control components 22*a-g* are switched by bits of the digital word output from the amplitude component and so regulated by the digital word output from the amplitude component. If a bit is "1" or "high," the corresponding control component is switched on, and so current flows from that control component to appropriate current source 25*a-g* along bias control lines 23*a-g*. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 25*a-g* receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Returning now to the embodiment of FIG. 1, each current source serves as a potential current source, and is capable of generating a current, which is output to current source lines 26*a-g* respectively. Each current source may or may not act as a current source, and so may or may not generate a current, because it is regulated via the appropriate digital word value regulating a control component. Activation of any current source, and generation of current from that current source, is dependant upon the value of the appropriate bit from the digital representation of the amplitude component regulating the appropriate control component.

It should be noted that the current sources are not an amplifier or amplifiers in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates.

The combined current, i.e. the sum of any current output from current sources 25*a-g*, is the current sources output. Thus the embodiment may act as an attenuator and/or amplifier. No further circuitry or components are necessary between the current sources to combine current from each current source and so provide a useful output current. Therefore, the combined current, which is output on line 27, and shown as b, may be used as desired, e.g., as an amplifier, as an attenuator, to drive a load, etc.

In the preferred embodiments, the current sources vary in current output and size. This provides various weighting to the currents that are potentially supplied by those current sources. For example, in one preferred embodiment, a first current source is twice the size of a next current source, which in turn is twice the size of a next current source, and so on until a final current source. The number of current sources may be matched to the number of bits of the digital control word, so that the largest current source is controlled by the MSB of the amplitude word, the next bit of the word controls the next largest current source, etc., until the LSB, which is sent to the smallest current source. Of course, as had been noted above, other embodiments may have a different pattern of matching bit to current source, including use of a switching network. Moreover, in an especially preferred embodiment, duplicate current sources—of the same size—are provided, as well as current sources that vary in size. In yet other embodiments, other wave characteristics may be provided to other current sources and so regulate those sources.

In order to obtain a transfer function h(t) for the preferred embodiments, the following analysis is used. It should be noted that this analysis, and similar analysis, may be used to derive other transfer functions as desired in various embodiments of the present invention.

The output signal $s_{out}$ from transistor 25 can be expressed as:

(a)

$$S_{out}(t) = As(t)$$

with s(t) representing the input signal and A the gain of the amplifier. Since $s_{out}$ is comprised of a combination of input signals $s_i(t)$, where i=1 . . . N, and since each input signal provides a different value or weight to the output signal as had been described above, the output signal may also be represented by (b)

$$s_{out}(t) = A \sum_{i=1}^{N} W_i s_i(t)$$

where $W_i$ represents the weight given to each signal $s_i(t)$ so that the weighted sum of all signals equals s(t).

If gain is taken out of the equation (b), s(t) can be represented by:

(c)

$$s(t) = \sum_{-i}^{N} W_i s_i(t)$$

Note that, as had been described above, if each segment is double the size of its neighbor in the preferred embodiments described above, then the weighting can be defined as:

(d)

$$W_i = 2^{i-1}$$

Of course, in other embodiments, if the segments are weighted differently, the value of $W_i$ will change accordingly. Since, the signals $s_i(t)$ are, as noted above, time domain square waveforms corresponding to the N-bit quantized representation of the signal s(t), if the value of $W_i$ in (d) is substituted into (c), the input signal can be represented by:

(e)

$$s(t) = \sum_{i=1}^{N} 2^i s_i(t)$$

with $s_1(t)$ being the LSB and $S_N(t)$, being the MSB.

The output signal may also be expressed in polar coordinates as:

(f)

$$s_{out}^{RF}(t) = s_{out}(t)\cos(\omega_c t + \theta(t))$$

and, if equations (c) and (f) are combined, as:

(g)

$$s_{out}^{RF}(t) = A\sum_{i=1}^{N} W_i s_i(t)\cos(\omega_c t + \theta(t))$$

As noise in the output signal may be understood to be a function of noise in the amplitude characteristic and the phase characteristic, the noise floor in the output signal may be obtained by convolving the noise floor in the amplitude characteristic s(t) with that of the phase characteristic θ(t). Hence, in order to reduce the noise floor in the composite RF signal, the noise floors in both s(t) and θ(t) could be reduced. In the preferred embodiment here, only signal s(t) is filtered, as had been described above, however in other embodiments either or both the amplitude characteristic s(t) and the phase characteristic θ(t) may be filtered or otherwise modified.

Appropriate values for filtering s(t) are obtained by first obtaining the desired noise floor in $s_{out}$ Insofar as the composite filtered signal $s_{out}$ maybe represented by:

(h)

$$\bar{s}_{out}^{RF}(t) = [s_{out}(t) * h(t)]\cos(\omega_c t + \theta(t))$$

then, it also possible to apply equation (g) to equation (h), and obtain (i)

$$\bar{s}_{out}^{RF}(t) = A\sum_{i=1}^{N} W_i[s_i(t) * h(t)]\cos(\omega_c t + \theta(t))$$

Thus, it can be seen that each segment can be filtered in order to achieve filtering of the output signal.

Other embodiments may implement h(t) values, once obtained, in other ways besides filtering. For example, in other embodiments, h(t) may be implemented through a sum of partial values of h(t). In a preferred embodiment, with a number of transistor segments such as transistor 25 shown in FIG. 1, each segment may incorporate partial values of h(t), by modifying reaction speeds accordingly of each segment to input signals $s(t)_1$-$s(t)_n$. By reacting more slowly to excitation, any given segment will effectively mimic a filter with a partial value of h(t). The combined output of the segments then amount to a sum of the partial values of h(t), or h(t).

As other embodiments, a digitized wave that is desired to be filtered using an h(t) value may be filtered at multiple locations along the wave, using appropriate partial values of the desired h(t) value. That is, there may be sequential filters on a wave line, or the wave may be split into a number of lines each of which is filtered.

Application of h(t) through partial values of h(t) is through a plurality of signals that are summed to an output signal. Thus, along any of the plurality of the weighted signals before they are summed to an output signal, partial values of h(t) are applied as desired. So for example, if the wave is divided into one or more characteristics, and/or divided in other manners, h(t) may also be applied to those characteristics and/or divisions, again using appropriate partial values of the desired h(t) value to obtain a sum equal to the desired h(t).

Any partial values of h(t) may be derived and applied as desired. Thus, unequal partial values of h(t) may be obtained and applied as desired, across various weighted signals, as well as equal values.

FIG. 2 is a chart illustrating the far-end noise reduction that may be achieved in a preferred embodiment of the invention. The example shown in FIG. 2 was produced using a 7-bit digital segmented amplifier of the preferred embodiment of the invention. The noise reduction filter with a derived h(t) value in this embodiment was a $4^{th}$ order Butterworth response with a bandwidth of 10 MHz. A CDMA2000 signal was used as the electromagnetic input signal in this example. As may be seen from FIG. 2, the noise floor level has been reduced in the filtered signal.

Figure 3:
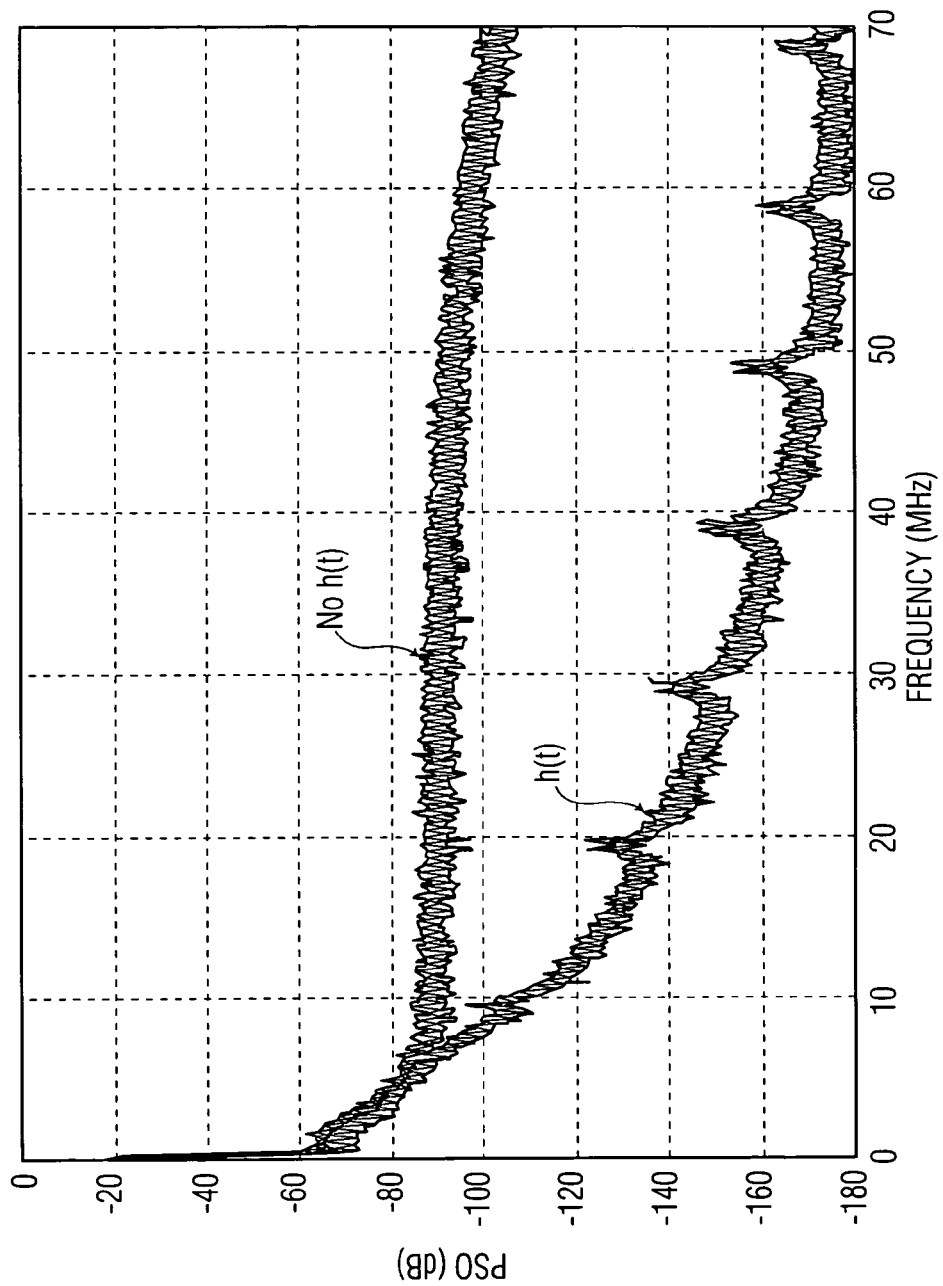
FIG. 3 shows various results of a preferred embodiment.
Figure 4:
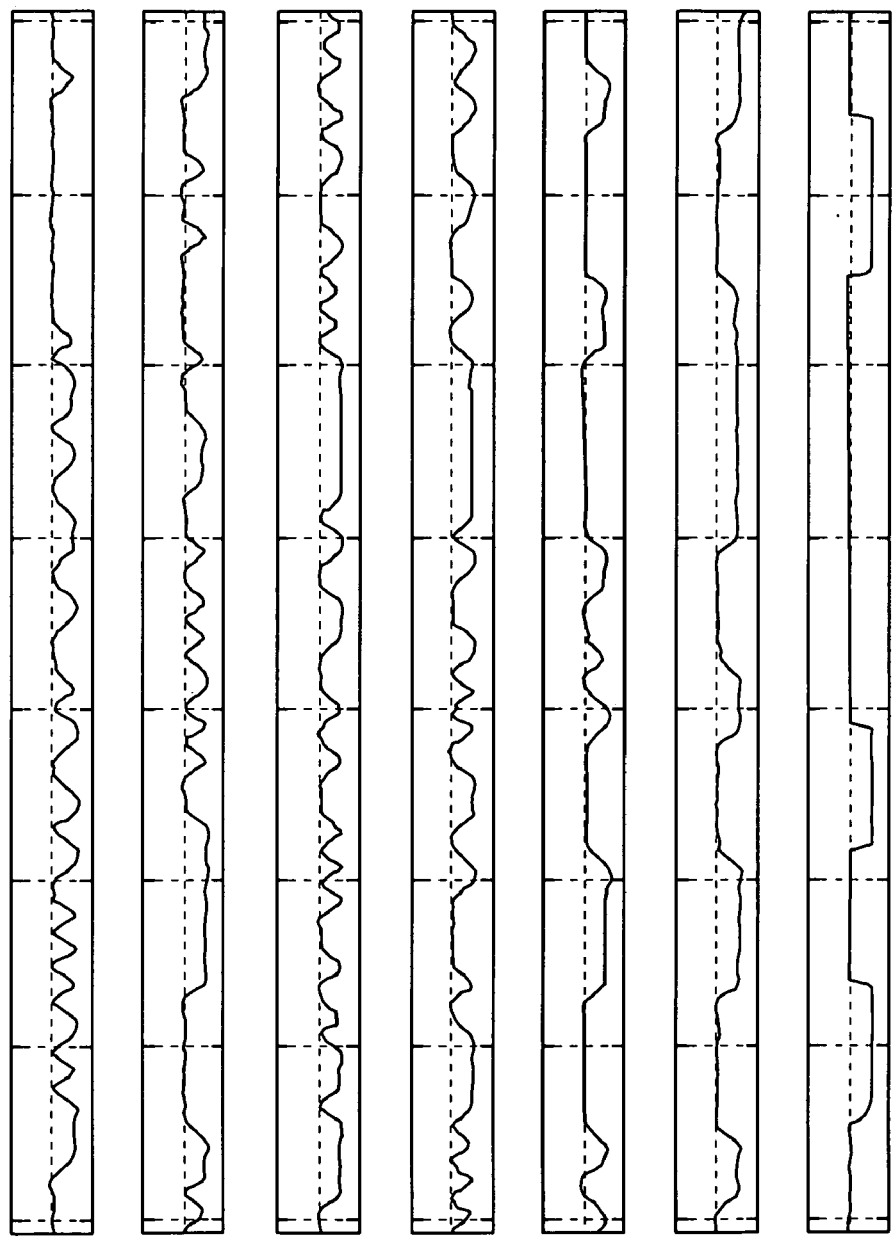
FIG. 4 shows various results of a preferred embodiment.

FIG. 3 is a series of screenshots showing the time-domain waveforms of the bits of a digital word representing the amplitude component of the electromagnetic signal $a^m$. As FIG. 3 illustrates, the use of an h(t) filter of this preferred embodiment softens the edges of the originally square waveforms of the bits, i.e., it slows the transition from one state to the next. This in turn reduces the effect of quantization noise in the bits on the far-end noise floor of the reconstructed IQ signal.

The use of the preferred embodiments may provide a capability for wide band amplitude modification in an associated transmitter because it makes possible linear amplification and/or attenuation across a relatively large frequency spectrum. Thus, embodiments may be used for cellular and other transmitters, as is described further herein. Moreover, the relatively low input capacitance along a phase path of the preferred embodiments minimizes matching requirements.

Advantageously, embodiments of the present invention may improve efficiency over conventional power amplification, because linearity of the transmission is not dependent on the linearity of the amplifier, but instead depends only on how linearly the currents add to the load. Accordingly, each current source can be biased as a non-linear current source, such as Class B or C, to maximize the efficiency. Efficiency may further be improved because there is little or no quiescent current draw for disabled current sources.

In the illustrated embodiments, power control may readily be achieved because the output current is dependent primarily on the signal drive level. Increasing or decreasing the signal drive level, for example, with a variable gain amplifier or attenuator, causes a corresponding increase or decrease in the output current. In addition, an increase or decrease of the bias to the drive controller, also causes a respective increase or decrease in the output current. It should be noted that any increase will not be indefinite of course, but will reach limits imposed by the segmentation of the transistor.

As should be understood, any suitable types of current sources, for example, other transistor segments and/or formats as well as other devices or methods, may be used with any of the embodiments of the present invention where desired.

Various types of system architectures may be utilized for constructing the embodiments of the present invention. One of ordinary skill in the art will accordingly appreciate that embodiments of the invention or various components and/or feature thereof may be entirely comprised of hardware, software or may be a combination of software and hardware. The embodiments or various components may also be provided on a semiconductor device where desired, such as an integrated circuit or an application-specific integrated circuit composition; some examples include silicon (Si), silicon germanium (SiGe) or gallium arsenide (GaAs) substrates.

Various embodiments may provide desired levels of precision. For example, the length of the digital word may be longer or shorter in various embodiments, thus providing a more or less precise digitization of the wave. As other examples, the number of control components, transistor segments, etc. may all be varied as desired. Additionally, in various embodiments, non-linear components may be utilized if desired, although in these embodiments, it is preferred to utilize non-linear components in an amplitude path after a signal has been digitized.

Various embodiments may take the form of an entirely hardware embodiment or an embodiment combining software and hardware aspects. Accordingly, individual blocks and combinations of blocks in the drawings support combinations of means for performing the specified functions and combinations of steps for performing the specified functions. Each of the blocks of the drawings, and combinations of blocks of the drawings, may be embodied in many different ways, as is well known to those of skill in the art.

While the invention has been described by illustrative embodiments, additional advantages and modifications will occur to those skilled in the art. Therefore, the invention in its broader aspects is not limited to specific details shown and described herein. Modifications, for example, may be made without departing from the spirit and scope of the invention. In addition, preferred embodiments may include apparatus and/or methods and/or articles of manufacture that are specialized for particular input signals, carrier waves and output signals e.g. embodiments may be used in various RF, microprocessor, microcontroller and/or computer devices, e.g. cell phones, such as CDMA, CDMA2000, W-CDMA, GSM, TDMA, as well as other wired and wireless devices, e.g. Bluetooth, 802.11a, -b, -g, radar, 1xRTT, two-way radios, GPRS, computers and computer communication devices, PDA's and other handheld devices, etc. Accordingly, it is intended that the invention not be limited to the specific illustrative embodiments, but be interpreted within the full spirit and scope of the appended claims and their equivalents.

What is claimed is:

1. A method of applying a transfer function comprising:
   determining a desired output wave parameter;
   isolating an amplitude characteristic from a phase characteristic of an input wave;
   deriving a transfer function from said desired output wave parameter;
   applying said transfer function to the amplitude characteristic of said input wave; and
   generating an output wave by combining the amplitude and phase characteristics, said output wave having the desired output wave parameter as a result of applying the transfer function to the amplitude characteristic of the input wave,
   wherein determining a desired output wave parameter further comprises determining an output signal noise parameter and wherein deriving said transfer function from said desired output wave parameter further comprises deriving an impulse response for a filter.

2. A method as in claim 1 wherein applying said transfer function to said amplitude characteristic of said wave further comprises applying said impulse response, via a filter, to said amplitude characteristic.

3. A method as in claim 2 wherein said filter is a low pass filter.

4. A method as in claim 2 wherein said filter is a 4th order Butterworth filter.

5. A method as in claim 1, wherein the transfer function is applied solely to the amplitude characteristic of said input wave.

6. An apparatus for applying a transfer function comprising:
   means for determining a desired output wave parameter;
   means for isolating an amplitude characteristic and a phase characteristic of an input wave;
   means for deriving a transfer function from said desired output wave parameter; and,
   means for applying said transfer function to the amplitude characteristic of said input wave;
   and means for combining the amplitude and phase characteristics to generate an output wave, said output wave having the desired output wave parameter as a result of the applying means applying the transfer function to the amplitude characteristic of the input wave,
   wherein said means for determining a desired output wave parameter further comprises means for determining an output signal noise parameter and wherein said means for deriving said transfer function from said desired output wave parameter further comprises deriving an impulse response for a filter.

7. An apparatus as in claim 6 wherein applying said transfer function to said amplitude characteristic of said wave further comprises applying said impulse response, via a filter, to said amplitude characteristic.

8. An apparatus as in claim 7 wherein said filter is a low pass filter.

9. An apparatus as in claim 7 wherein said filter is a 4th order Butterworth filter.

* * * * *